(12) United States Patent
Tsuchiya

(10) Patent No.: US 7,649,376 B2
(45) Date of Patent: Jan. 19, 2010

(54) SEMICONDUCTOR DEVICE INCLUDING TEST ELEMENT GROUP AND METHOD FOR TESTING THEREFOR

(75) Inventor: Tomohiro Tsuchiya, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 12/081,932

(22) Filed: Apr. 23, 2008

(65) Prior Publication Data

US 2008/0265928 A1  Oct. 30, 2008

(30) Foreign Application Priority Data

Apr. 26, 2007  (JP) ............................ 2007-117071

(51) Int. Cl.
  *G01R 31/26*  (2006.01)
(52) U.S. Cl. ...................... 324/765; 324/763
(58) Field of Classification Search ........................ None
  See application file for complete search history.

(56) References Cited

U.S. PATENT DOCUMENTS 6,239,603 B1 *  5/2001  Ukei et al. ................. 324/763

6,489,799 B1 * 12/2002  Murakami ................... 324/765
2003/0062521 A1 *  4/2003  Jang et al. ..................... 257/48

FOREIGN PATENT DOCUMENTS

JP          9-213901          8/1997

* cited by examiner

*Primary Examiner*—Minh N Tang
(74) *Attorney, Agent, or Firm*—McGinn IP Law Group PLLC

(57) ABSTRACT

A semiconductor device, in which a test element group (TEG) including check patterns is formed together with a chip on a wafer so as to measure electric characteristics thereof, includes an interface circuit for selecting the check pattern from the test element group, a protection resistor connected in series with the test element group so as to protect the test element group, and a dummy element connected in series with the test element group. It allows the TEG test, which can be performed after packaging, to be easily performed at a high precision irrespective of dispersions of parasitic resistances and protection resistors. The test result is corrected based on the calculated values of the parasitic resistance and protection resistor and is then stored in a specific table form, wherein a pass/fail decision is made as to whether or not the test result falls within the prescribed range.

10 Claims, 8 Drawing Sheets

P/W TEST RESULT

| WAFER TEST ITEM | FLG(BIN) | ELEVEN EFECTIVE CHIPS |
|---|---|---|
| OPERTION CURRENT: FAIL | 0 | NUMBER OF FAIL: 1 |
| TEST 1: FAIL | 1 | NUMBER OF FAIL: 3 |
| TEST 2: FAIL | 2 | NUMBER OF FAIL: 2 |
| TEST 3: PASS | 3 | NUMBER OF PASS: 5 |

PASS_FLG

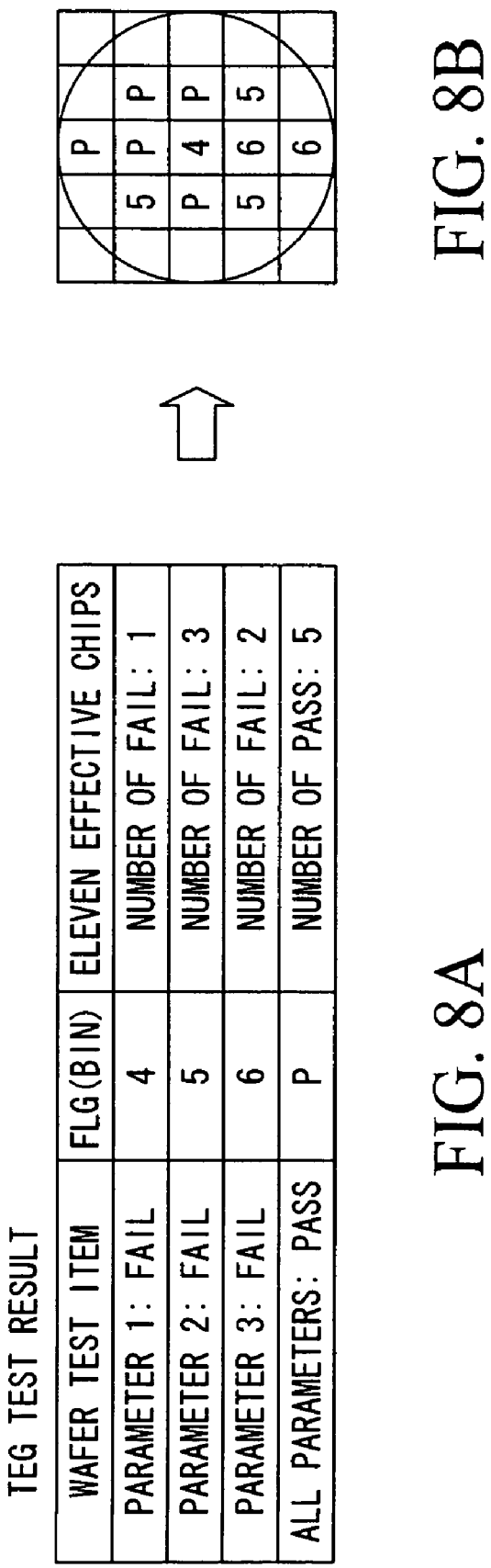

SEMICONDUCTOR DEVICE INCLUDING TEST ELEMENT GROUP AND METHOD FOR TESTING THEREFOR

BACKGROUND OF THE INVENTION

1. Field of the Invention

The present invention relates to semiconductor devices having check patterns or test element groups (TEG) for the purpose of testing of electric characteristics thereof required in development, design, and process check in manufacturing.

The present application claims priority on Japanese Patent Application No. 2007-117071, the content of which is incorporated herein by reference.

2. Description of the Related Art

P/W tests (i.e. probe tests and/or wafer tests) have been conventionally performed to achieve operation checks and characteristic checks with respect to chips formed on wafers, thus making determination as to qualities of chips. They are important factors of inspection to check completions of semiconductor devices or semiconductor memories such as DRAM.

In the present technology, test element groups (TEG) for the purpose of characteristic checks are formed on scribing lines drawn between chips adjoining together on a wafer. There are provided various types of test element groups such as transistors (e.g. MOS transistors and bipolar transistors), memory cells, and resistors for measuring resistances of diffusion layers and lines, which are incorporated in the product circuitry of semiconductor memories.

However, it is very difficult to use probe cards (specified for the purpose of wafer tests such as pass/fail tests of semiconductor chips) with respect to test element groups formed on scribing lines.

In order to realize testing of test element groups formed on scribing lines, it is necessary to use probe cards specified for the purpose of testing test element groups; and it is necessary to perform checking processes specified for the purpose of characteristic checks by test element groups, thus achieving characteristic checks on semiconductor devices.

Compared with test devices for the purpose of wafer tests in mass production, test devices specified for the purpose of characteristic checks do not have multi-check functions for simultaneously checking multiple chips; hence, it is unrealistic to employ them because it takes enormous time to check all check points of wafers.

To solve the aforementioned drawback, test element groups are formed inside of semiconductor chips instead of scribing lines, thus allowing characteristic checks to be performed by use of probe cards and test devices having multi-check functions in testing of wafers in mass production. This technology is disclosed in Patent Document 1, for example.

Patent Document 1: Japanese Unexamined Patent Application Publication No. H09-213901

Patent Document 1 teaches a semiconductor memory in which multiple pads are specifically formed and come in contact with probe tips of probe cards. This semiconductor device suffers from reliability with regard to test results due to parasitic resistances of lines and circuits for selecting check patterns in test element groups.

In addition to parasitic resistances, this semiconductor memory additionally needs protection resistors (having high resistances) attached to check patterns in order to protect check patterns from being destroyed during testing of test element groups. Dispersions of protection resistors may degrade precision and reliability in testing.

When test element groups are formed on chips instead of scribing lines after the semiconductor device is encapsulated in a package, it is necessary to use pads specified for the purpose of testing test element groups. In manufacturing, wire bonding is not performed on these pads; hence, after the semiconductor device is encapsulated in a package, it is impossible to perform testing of test element groups.

SUMMARY OF THE INVENTION

It is an object of the present invention to provide a semiconductor device, which ensures testing of test element groups with respect to all chips formed on a wafer with ease, which ensures testing of test element groups after encapsulated in a package, and which achieves testing of test element groups at a high precision irrespective of parasitic resistances and dispersions of protection resistors.

It is another object of the present invention to provide a test method for the aforementioned semiconductor device.

In a first aspect of the present invention, a test element group (TEG) including at least one check pattern is formed in connection with a chip formed on a wafer so as to measure electric characteristics thereof. A semiconductor device having the test element group further includes an interface circuit for selecting the check pattern from among the test element group, a protection resistor that is connected in series with the test element group in the interface circuit so as to protect the test element group, and a dummy element that is connected in series with the test element group in the interface circuit.

In the above, the interface circuit has a first pad for receiving an input signal designating the check pattern selected from among the test element group in response to a control signal and a second pad for outputting the test result of the designated check pattern. The dummy element is connected in series with the protection resistor in the interface circuit, wherein, when the dummy element is selected, a node between the check pattern and the protection resistor is connected to the second pad for outputting the test result. It is possible to form a plurality of test element groups and a plurality of dummy elements in the periphery of the chip.

In a second aspect of the present invention, a test method is adapted to the aforementioned semiconductor device, wherein it includes a measurement step, in which the interface circuit is controlled so as to test the check pattern of the test element group and in which a parasitic resistance of the interface circuit and a resistance of the protection resistor are calculated based on the measured electric characteristics of the check pattern, a determination step for determining whether or not the measured electric characteristics of the check pattern fall within the prescribed range, which is determined in advance, and a storing step for storing the test result of the check pattern in a storage device in connection with a wafer number and a chip number indicating the position information of the chip on the wafer.

In the above, a pass/fail decision is made as to whether or not the measured electric characteristics of the check pattern fall within the prescribed range, thus setting a flag with respect to the chip on the wafer.

The test method further includes a correction step for correcting the test result of the check pattern based on the calculated parasitic resistance and the calculated resistance of the protection resistor.

In a third aspect of the present invention, the test element group includes a plurality of check patterns formed in connection with the chip on the wafer. The semiconductor device having the test element group further includes a first pad for receiving an input signal, a second pad for outputting an output signal, and an interface circuit for selecting one of the check patterns in response to the control signal, wherein the check patterns are arranged between the input terminal and the output terminal.

In the above, the interface circuit includes a plurality of transfer gates in correspondence with the check patterns, wherein the transfer gates and the check patterns are formed in parallel with each other between the first pad and the second pad. The semiconductor device further includes a dummy element that is arranged between the first pad and the second pad in the interface circuit.

As described above, the present invention offers the following effects.

(1) The test result is corrected based on the calculated values of the parasitic resistance (which exists in the path of the interface circuit relative to the test element group) and the protection resistor; hence, it is possible to measure the electric characteristics of the check pattern of the test element group (e.g. MOS transistors, diodes, and resistances of lines and diffusion layers) at a high precision irrespective of dispersions of parasitic resistance and dispersions of resistance of the protection resistor.

(2) The present invention does not additionally require a plurality of test pads, wherein the control signal is applied to a single test pad so as to set a test mode, thus allowing any one of the check patterns of the test element group to be tested selectively.

(3) The normal P/W test (i.e. wafer tests and/or probe tests) has been conventionally performed using probe cards (e.g. P/W cards and testers) in mass production. The present invention can perform measurement of the electric characteristics of the check patterns of the test element group by use of the conventionally-known probe card simultaneously in the P/W test. This makes it possible to easily and rapidly measure the electric characteristics of chips included in wafers in association with lots. Thus, it is possible to easily perform defectiveness analysis with respect to chips, wafers, and lots based on measurement results of test element groups.

(4) The present invention requires a single test pad for inputting the control signal so as to set the test mode. This allows other pads (serving as input/output terminals for inputting signals activating the semiconductor device and for outputting the test result, etc.) to be used for the purpose of the TEG test; hence, it is possible to perform the TEG test after packaging. That is, after shipment, it is possible to analyze the defectiveness of products based on measurement data.

BRIEF DESCRIPTION OF THE DRAWINGS

These and other objects, aspects, and embodiments of the present invention will be described in more detail with reference to the following drawings, in which:

FIG. 8A is a table showing the results of the TEG test stored in the database shown in FIG. 6;

FIG. 8B is an illustration showing the position information of chips on a wafer in connection with pass/fail parameters in the TEG test;

DESCRIPTION OF THE PREFERRED EMBODIMENT

The present invention will be described in further detail by way of examples with reference to the accompanying drawings.

Figure 1:
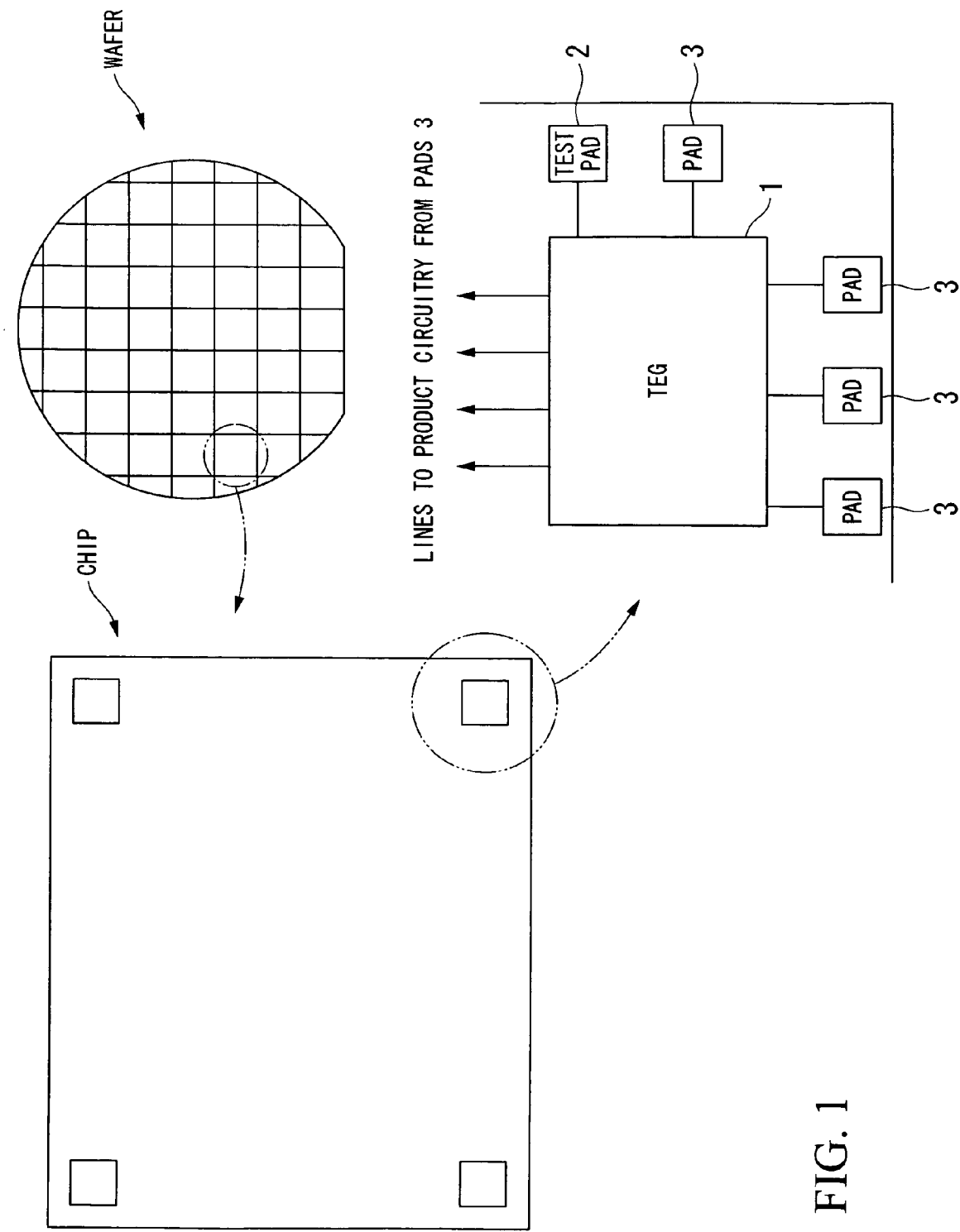
FIG. 1 is an illustration showing the relationship between a wafer, a chip, and a test element group (TEG) with respect to a semiconductor device in accordance with a preferred embodiment of the present invention.

FIG. 1 is an illustration showing the relationship between a wafer, a chip, and test element groups (TEG) with respect to a semiconductor device in accordance with a preferred embodiment of the present invention.

Four test element groups (TEG) 1 are formed on four corners in the periphery of a chip forming the product circuitry on a wafer, for example. Each TEG 1 is connected to a test pad 2 and other pads 3, which adjoin each other. It is possible to additionally form another TEG 1 at the center of the chip. This TEG 1 is formed to check electric characteristics of check patterns (determining operation speed and operation voltage in the product circuitry) within multiple check patterns instead of semiconductor elements of the product circuitry.

Figures 2A, 2B:
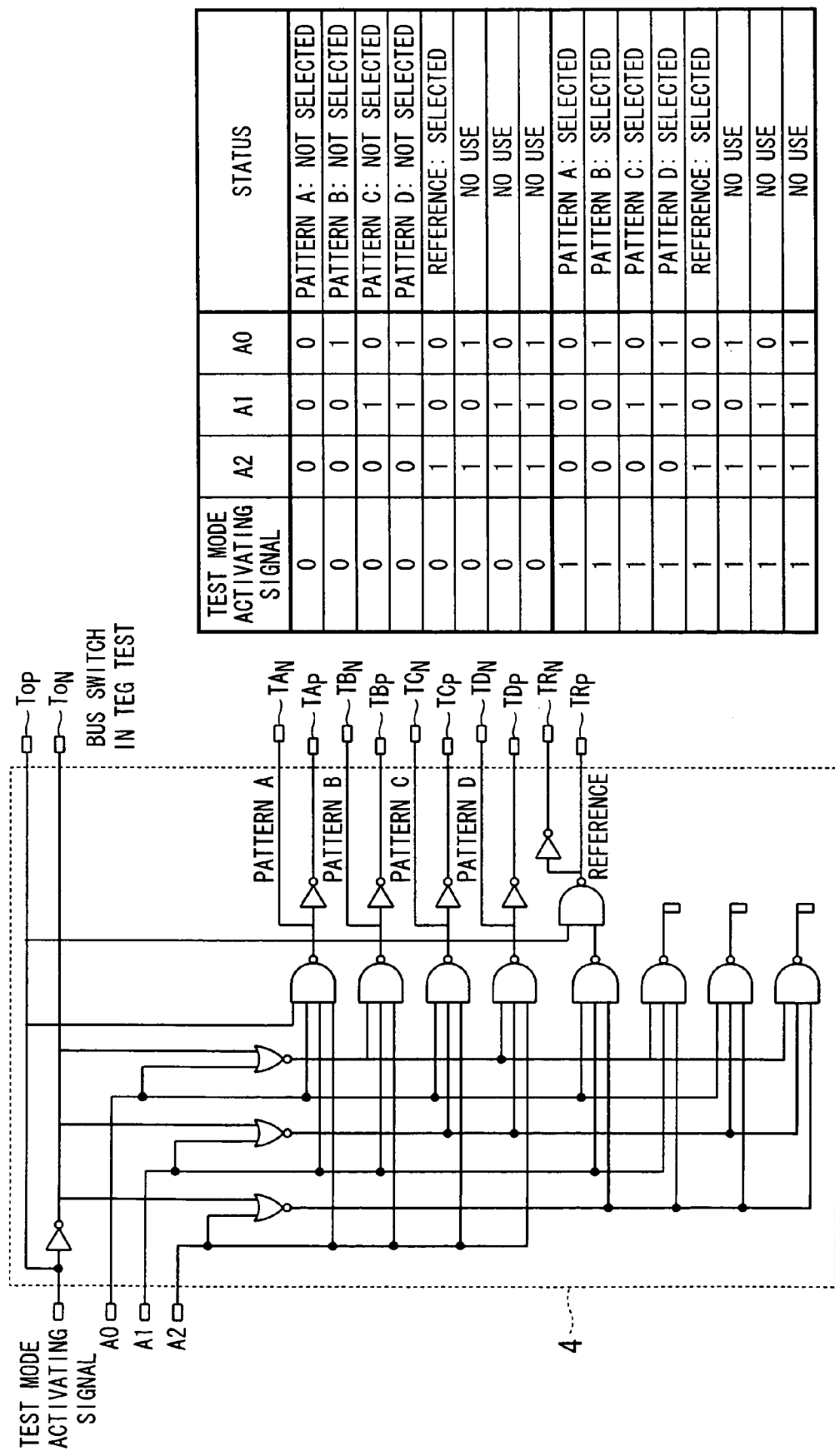
FIG. 2A is a circuit diagram showing an interface control circuit.
FIG. 2B is a table showing how check patterns included in the test element group are selected in response to a test mode activating signal and signals supplied to pads A0, A1, and A2 connected to the interface control circuit.

FIG. 2A is a block diagram showing the constitution of an interface control circuit 4 formed inside of the TEG 1. FIG. 2B shows a table showing check patterns (e.g. transistors, diodes, and resistors), which are selected within the TEG 1 based on combinations of signals supplied to pads 3 (e.g. pads A0, A1, and A2, each of which is connected to an input terminal receiving an address signal in a normal operation mode) when a control signal (having a high level designating a TEG test mode) is supplied to the test pad 2. As the pads 3 for use in testing and selection of check patterns in the TEG 1, it is possible to use pads each connected to an input terminal of the product circuitry, i.e. gates of MOS transistors, for example.

A control signal (or a test mode activating signal) is supplied to the test pad 2 so as to select either a TEG test mode (for testing a chip by use of the TEG 1) or a normal operation mode. When a control signal having a low level (or "0") is supplied to the test pad 2, the normal mode is selected for the chip. When a control signal having a high level (or "1") is supplied to the test pad 2, the TEG test mode is selected for the chip. The table of FIG. 2B shows that check patterns (or devices) A, B, C, D and a dummy element (referred to as a reference, i.e. Ref) are selected in response to values of test mode activating signals and combinations of signals supplied to the pads A0, A1, and A2.

When a control signal having a high level is supplied to the test pad 2 and signals, i.e. (0,0,0), are supplied to the pads A0, A1, and A2 each connected to the input terminal of the product circuitry, the check pattern A is selected. When signals, i.e. (0,1,0), are supplied to the pads A0, A1, and A2, the check pattern C is selected. When signals, i.e. (0,0,1), are supplied to the pads A0, A1, and A2, the dummy element (i.e. reference) is selected.

In the interface control circuit 4 of FIG. 2A which operates in accordance with the content of the table of FIG. 2B showing combinations of input signals of the pads A0, A1, and A2, when a control signal having a high level is supplied to the test pad 2, a terminal $To_P$ is set to a high level, while a terminal $To_N$ is set to a low level, thus selecting a TEG test mode for a chip. When signals, i.e. (0,0,0), are supplied to the pads A0, A1, and A2, a terminal $TA_N$ is set to a low level, a terminal $TA_P$ is set to a high level, terminals $TB_N$, $TC_N$, $TD_N$, and $TR_N$ are each set to a high level, and terminals $TB_P$, $TC_P$, $TD_P$, and $TR_P$ are each set to a low level.

Figure 3:
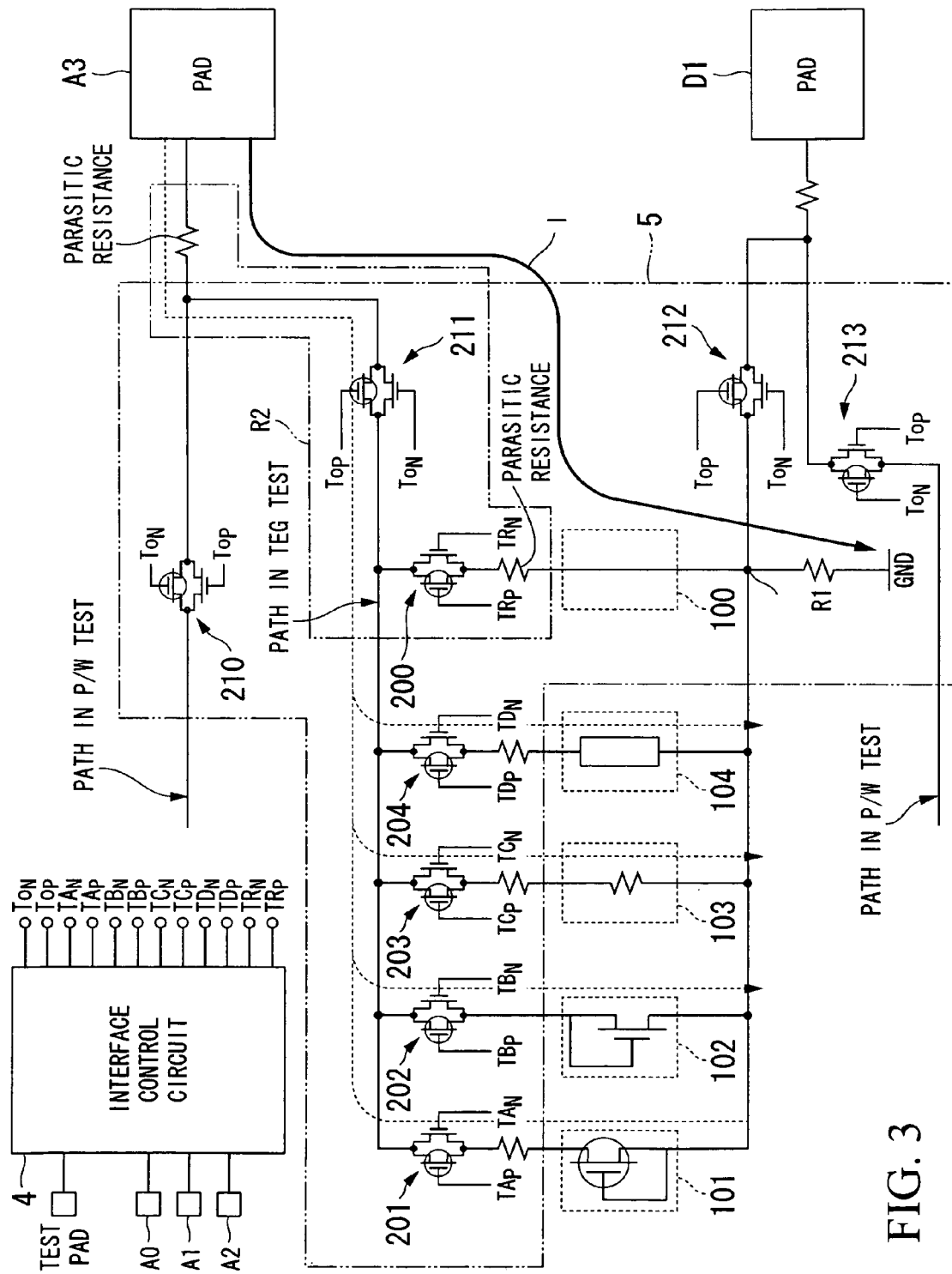
FIG. 3 is a circuit diagram showing the constitution of an interface circuit coupled to the test element group in connection with the interface control circuit.

Next, the relationship between check patterns included in the TEG 1 shown in FIG. 1 and an interface circuit 5 (which is controlled by the interface control circuit 4) will be described with reference to a circuit diagram shown in FIG. 3. FIG. 3 diagrammatically shows how check patterns of the TEG 1 are selected by the interface circuit 5 in response to output signals of the interface control circuit 4.

Figure 4:
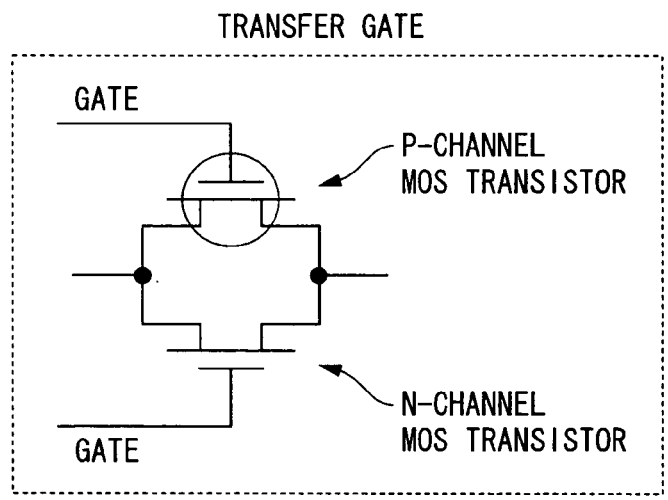
FIG. 4 is a circuit diagram showing a transfer gate incorporated in the interface circuit.

The interface circuit 5 includes transfer gates 200, 201, 202, 203, 204, 210, 211, 212, and 213, each of which has the same configuration shown in FIG. 4. That is, each transfer gate is configured using a p-channel MOS transistor and an n-channel MOS transistor, both of which are coupled together in parallel and which are supplied with different levels of voltage at gates thereof. When a high level is applied to the gate of one transistor, a low level is applied to the gate of another transistor. Thus, each transfer gate is controlled in an ON state activating a signal transfer or an OFF state deactivating the signal transfer.

As shown in FIG. 3, the TEG 1 includes a p-channel transistor 101, an n-channel transistor 102, a line resistor 103, and a diffusion resistor 104 (serving as check patterns) as well as a dummy element 100 (formed using a line only). This dummy element 100 is an important technical feature of the present embodiment.

Each of the check patterns 100 to 104 is selected by way of on/off controls of the transfer gates 200, 201, 202, 203, and 204 by the interface control circuit 4 and is connected to the pad 3 (denoted by A3). A voltage is applied to the pad A3 connected to the selected check pattern; then, a voltage is measured at another pad 3 (denoted by D1) so as to detect electric characteristics.

A first terminal of the transfer gate 210 is connected to the pad A3 via a parasitic resistance of a line. A first terminal of the transfer gate 211 is connected to the pad A3, and a second terminal thereof is connected to first terminals of the transfer gates 200, 201, 202, 203, and 204. Second terminals of the transfer gates 200, 201, 202, 203, and 204 are connected to a first terminal of the dummy element 100, the source of the p-channel MOS transistor 101, the drain and gate of the n-channel MOS transistor 102, a first terminal of the line resistor 103, and a first terminal of the diffusion resistor 104.

A first terminal of a protection resistor R1 (whose second terminal is grounded, i.e. whose second terminal is connected to a ground-potential line in a chip) is connected to a second terminal of the dummy element 100, the gate and drain of the p-channel MOS transistor 101, the source of the n-channel MOS transistor 102, a second terminal of the wiring resistor 103, and a second terminal of the diffusion resistor 104.

In measurement of electric characteristics of the p-channel MOS transistor 101, for example, a parasitic resistance R2 (corresponding to the sum of an on-resistance of the transfer gate 211, an on-resistance of the transfer gate 201, and resistances of lines connected therebetween) exists between the pad A3 and the p-channel MOS transistor 101.

The protection resistor R1 having a high resistance is connected between the gate and drain of the p-channel MOS transistor 101 and the ground in order to protect the check pattern from being destroyed.

In the case of the P/W test (in which a chip is set to the normal mode), a control signal having a low level is supplied to the test pad 2 so that the terminal $To_P$ is set to a low level while the terminal $To_N$ is set to a high level, whereby the transfer gates 210 and 211 are turned on so that the pads A3 and D1 (similarly with the pads A0, A1, and A2 whose transfer gates are not shown in FIG. 3) are connected to the product circuitry. When the transfer gates 211 and 212 are turned off, the pads A3 and D1 are not connected to the check patterns of the TEG 1.

When a control signal having a high level is supplied to the test pad 2 in order to set a chip to the TEG test mode, the terminal $To_P$ is set to a high level, and the terminal $To_N$ is set to a low level, whereby the transfer gates 210 and 211 are turned off so that the pads A3 and D1 (similarly with the pads A0, A1, and A2 whose transfer gates are not shown in FIG. 3) are not connected to the product circuitry. When the transfer gates 211 and 212 are turned on, the pads A3 and D1 are connectible to any one of the check patterns 100 to 104 of the TEG 1 in response to the output signal of the interface control circuit 4.

Figure 5:
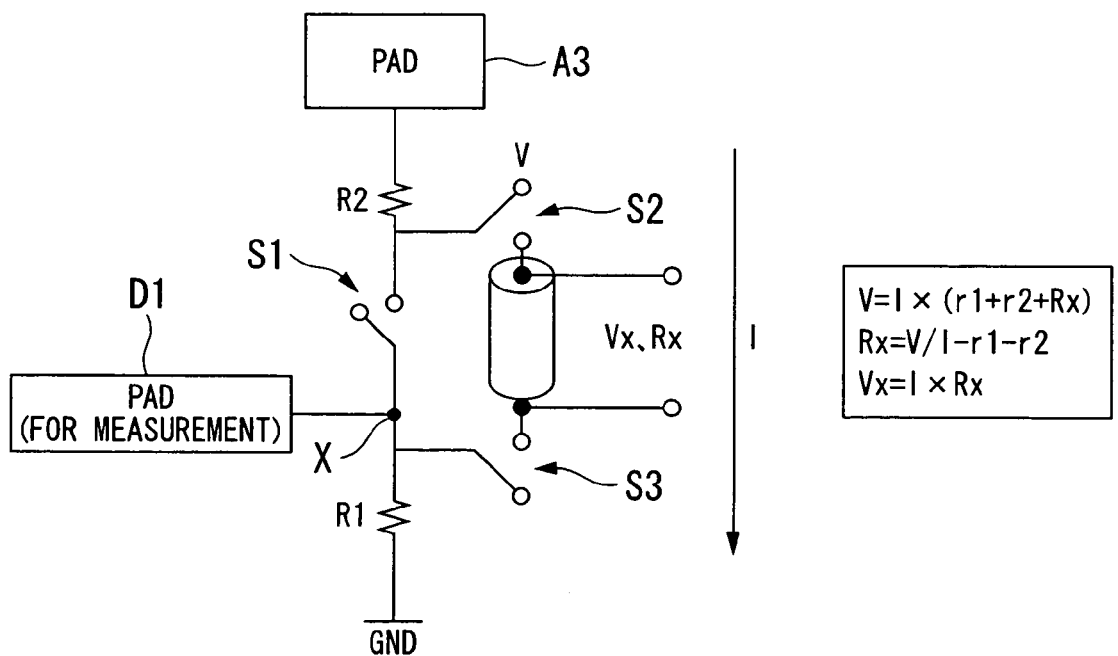
FIG. 5 is a circuit diagram showing the relationship between two pads and a check pattern in connection with FIG. 3.

In the testing of the TEG 1, a chip is set to the TEG test mode by turning on the transfer gates 211 and 212. Then, signals, i.e. (0,0,1), are supplied to the pads A0, A1, and A2 while the transfer gate 200 is turned on, thus selecting the dummy element 100. This is shown in an equivalent circuit of FIG. 5, in which a switch S1 is turned on, while switches S2 and S3 connected to a check pattern (e.g. the dummy element 100) are turned off.

The dummy element 100 is formed using only a line connected between the second terminal of the transfer gate 200 and the first terminal of the protection resistor R1, which are thus short-circuited. The first terminal of the protection resistor R1 corresponds to a node X, which is connected to the other check patterns 101 to 104 and which is a connection point for connecting the pad A3, the protection resistor R1, and the parasitic resistor R2.

A constant voltage source (not shown) applies a voltage V to the pad A3 so as to cause a current (namely, a dummy current) I, which is then measured so as to calculate resistances r1 and r2 of the protection resistor R1 and the parasitic resistor R2 by use of a measured voltage V1 of the node X measured at the pad D1 in accordance with equations (1) and (2).

$$I = \frac{V}{r1 + r2} \quad (1)$$

$$V1 = I \cdot r1 \quad (2)$$

After completion of calculations of the resistances r1 and r2 of the protection resistor R1 and the parasitic resistor R2, any one of the transfer gates 201, 202, 203, and 204 is turned on so as to select any one of the check patterns 101, 102, 103, and 104. This is realized by turning on the switches S2 and S3 while turning off the switch S1 in the circuitry of FIG. 5. Then, the voltage V is applied to the pad A3 so as to cause the current I, which is measured so as to calculate an impedance Rx of the check pattern by use of a measured voltage Vx of the node X measured at the pad D1 in accordance with equations (3) and (4).

$$I = \frac{V}{r1 + r2 + Rx} \quad (3)$$

$$Rx = \left(\frac{V}{I}\right) - r1 - r2 \quad (4)$$

Thus, it is possible to calculate the voltage Vx in accordance with an equation (5).

$$Vx = I \cdot Rx \quad (5)$$

Specifically, each of the check patterns 101 to 104 is selected so as to measure electric characteristics thereof as follows:

(a) P-Channel MOS Transistor 101

Signals, i.e. (0,0,0), are applied to the pads A0, A1, and A2 so as to turn on the transfer gate 201 within the transfer gates 201 to 204, thus measuring electric characteristics of the p-channel MOS transistor 101. Herein, the drain current I is measured by varying the voltage V applied to the pad A3, thus measuring the on-resistance Rx of the p-channel MOS transistor 101 and calculating the drain-source voltage Vx of the p-channel MOS transistor 101. Thus, it is possible to easily measure a threshold voltage Vt based on the drain current I and the drain-source voltage Vx.

In the present embodiment, the p-channel MOS transistor 101 serves as a diode connection by electrically connecting the gate and drain thereof. The present embodiment can be modified such that the voltages at the gate and drain can be controlled independently by use of other pads 3.

(b) N-Channel MOS Transistor 102

Signals, i.e. (1,0,0), are applied to the pads A0, A1, and A2 so as to turn on the transfer gate 202 within the transfer gates 201 to 204, thus measuring electric characteristics of the n-channel MOS transistor 102. Herein, the drain current I is measured by varying the voltage V applied to the pad A3, thus measuring the on-resistance Rx of the n-channel MOS transistor 102 and calculating the drain-source voltage Vx of the n-channel MOS transistor 102. Thus, it is possible to easily measure the threshold voltage Vt based on the drain current I and the drain-source voltage Vx.

In the present embodiment, the n-channel MOS transistor 102 serves as a diode connection by electrically connecting the gate and drain thereof. The present embodiment can be modified such that voltages of the gate and drain can be controlled independently by use of other pads 3.

(c) Line Resistor 103

Signals, i.e. (0,1,0), are applied to the pads A0, A1, and A2 so as to turn on the transfer gate 203 within the transfer gates 201 to 204, thus measuring electric characteristics of the line resistor 103. Herein, the current I is measured by varying the voltage V applied to the pad A3, thus measuring the resistance Rx of the line resistor 103 and calculating the voltage Vx applied between the terminals of the line resistor 103. Thus, it is possible to easily measure the resistance Rx based on the current I and the voltage Vx applied to the line resistor 103.

(d) Diffusion Resistor 104

Signals, i.e. (1,1,0), are applied to the pads A0, A1, and A2 so as to turn on the transfer gate 204 within the transfer gates 201 to 204, thus measuring electric characteristics of the diffusion resistor 204. Herein, the current I is measured by varying the voltage V applied to the pad A3, thus measuring the resistance Rx of the diffusion resistor 104 and calculating the voltage Vx applied between the terminals of the diffusion resistor 104. Thus, it is possible to easily measure the resistance Rx based on the current I and the voltage Vx applied to the diffusion resistor 104 in consideration of voltage dependency.

Figure 6:
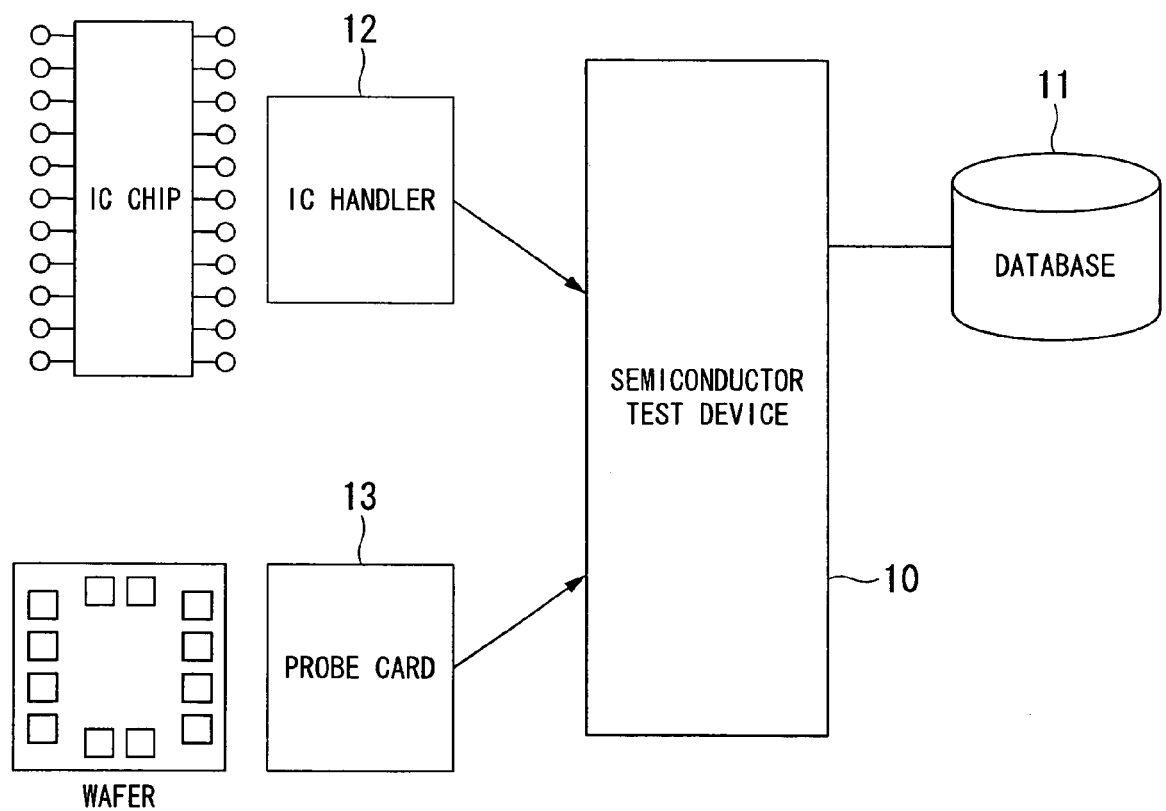
FIG. 6 is an illustration diagrammatically showing the constitution of a semiconductor test system for performing testing on semiconductor devices by use of a semiconductor test device, a database, an IC handler, and a probe card.

Next, a semiconductor test system will be described with reference to FIG. 6, wherein a semiconductor test device 10 measures electric characteristics of semiconductor devices (or chips). The semiconductor test device is connected to a database 11 that stores test data of semiconductor devices subjected to testing.

A TEG test is performed using a probe card 13 in units of chips formed on a wafer, wherein it is listed as one test item of the P/W test. After a chip (or an IC chip) is encapsulated in a package, an IC handler 12 is used to perform testing on a complete product. This makes it possible to easily perform defectiveness analysis using the TEG after packaging.

Figures 7A, 7B:
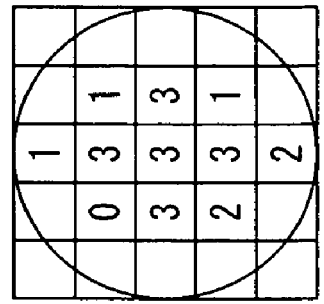
FIG. 7A is a table showing the results of the normal P/W test stored in the database shown in FIG. 6.
FIG. 7B is an illustration showing the position information of chips on a wafer in connection with pass/fail flags.

FIGS. 7A and 7B show test results of the conventionally-known P/W test performed on individual chips on a wafer. The semiconductor test device 10 operates the probe card 13 so as to bring its probe tip in contact with a pad of a chip subjected testing, wherein an input signal is applied to the pad connected to an input terminal so as to detect a current, or wherein a voltage is measured at a pad connected to an output terminal so as to determine whether or not the measured voltage falls within a prescribed range of numerical values (representing currents, voltages, and operation speeds), thus making a pass/fail decision on a chip subjected to testing. In order to set the normal mode activating the normal P/W test, a control signal having a low level is applied to a test pad of a chip in advance.

In the P/W test, the semiconductor device 10 stores test results of test items of chips in the database 11 in connection with lot numbers, wafer numbers, and chip numbers (representing positions of chips on each wafer) in the form of a table shown in FIG. 7A.

In the P/W test, pass/fail flags (FLG) are set with respect to test items. Specifically, a flag "0" is set with respect to each chip whose test result is "fail" in an operation current test; a flag "1" is set with respect to each chip whose test result is "fail" in test 1; a flag "2" is set with respect to each chip whose test result is "fail" in test 2; and a flag "3" is set with respect to each chip whose test result is "pass" in test 3, for example.

The table of FIG. 7A shows actual results of testing performed on certain wafer including a plurality of chips (which effectively work as complete products), wherein one defective chip is found in the operation current test; three defective (or fail) chips are found in test 1; two defective (or fail) chips are found in test 2; and five effective (or pass) chips are found in test 3.

Specifically, the semiconductor test device 10 stores the table of FIG. 7A in the database 11 with respect to eleven effective chips on a wafer, wherein the number of "fail" chip is set to "1" in the operation current test in connection with the flag "0"; the number of "fail" chips is set to "3" in test 1 in connection with the flag "1"; the number of "fail" chips is set to "2" in test 2 in connection with the flag "2"; and the number of "pass" chips is set to "5" in test 3 in connection with the flag "3".

FIG. 7B shows the test results of the semiconductor test device 10, in which the pass/fail flags in the aforementioned tests are positioned in connection with chips on a wafer, thus visually displaying test results in terms of position dependency.

As shown in FIG. 7B, flags are stored in units of chips; hence, it is possible to easily recognize flags of chips at respective positions on a wafer.

Next, the results of the TEG test performed on individual chips on a wafer will be described with reference to FIGS. 8A and 8B. FIG. 8A is a table showing electric characteristics (or parameters) of chips, flags, and test results. In order to perform the TEG test consecutively with the normal P/W test, the semiconductor test device 10 applies a control signal having a high level to a test pad included in each tested chip so as to set the TEG test mode while continuously bringing the probe tip of the probe card 13 in contact with each tested chip.

In the TEG test mode, the semiconductor test device 10 applies an input signal to a prescribed pad specifically used for the TEG test in connection with the input terminal, e.g. the pad A3 shown in FIG. 3, so as to select a dummy element, which is thus subjected to measurement with respect to the resistances of the parasitic resistor R2 and the protection resistor R1 as described above.

After completion of testing regarding the dummy element, the semiconductor test device 10 sequentially selects other check patterns in other test element groups, wherein currents flowing through them are measured, or voltages applied to their pads (e.g. the pad D1 shown in FIG. 3) connected to the output terminal are measured. Results are corrected so as to calculate the resistances of the parasitic resistor R2 and the protection resistor R1. Then, the semiconductor test device 1 determines whether or not the corrected results fall within a prescribed range of numerical values (representing currents, voltages, and operation speeds), thus making a pass/fail decision on each tested chip.

In the present embodiment, the semiconductor device 10 stores the aforementioned results of the TEG test (which is performed as a part of the normal P/W test) in the database 11 in the form of a table shown in FIG. 8A, wherein the results of the TEG test are stored in connection with lot numbers, wafer numbers, and chip numbers (representing positions of chips on a wafer) in association with test items.

Similar to the table of FIG. 7A, the table of FIG. 8A shows pass/fail flags (or parameters) with respect to test items of the TEG test, wherein "4" is set to parameter 1 (e.g. the threshold voltage Vt of the p-channel MOS transistor 101) with respect to fail chips; "5" is set to parameter 2 (e.g. the threshold voltage Vt of the n-channel MOS transistor 102) with respect to fail chips; "6" is set to parameter 3 (e.g. the threshold voltage Vt of the line resistor 103) with respect to fail chips; and "P" is set to chips whose test results fall within the prescribed range and thus pass all parameters.

FIG. 8B shows the test results of the semiconductor test device 10, in which the pass/fail flags in the TEG test using the aforementioned parameters are positioned in connection with chips on a wafer, thus visually displaying the test results in terms of position dependency.

As shown in FIG. 8B, it is possible to monitor qualities of chips by monitoring flags of chips; and it is possible to achieve FAIL_REJECT operations on chips.

It may be possible to detect parameters showing numerous fail events in lots based on the table of FIG. 8A. It may be possible to detect the distribution of fail chips on a wafer based on the test result visually shown in FIG. 8B. This makes it possible to easily specify processes causing fail events in the manufacturing of semiconductor devices and to easily perform defectiveness analysis allowing feedback to processes.

With reference to the test results and the position information of pass/fail chips on a wafer as shown in FIG. 7B and FIG. 8B, the semiconductor device 10 performs sorting tests for sorting desired chips from chips that pass the normal P/W test in consideration of categories, which are set based on results of decisions as to which parameters do not fall within the prescribed range and combinations of pass/fail parameters. Then, these categories are appropriately set to individual chips with respect to combinations of test results of the TEG test using the aforementioned parameters.

In dicing in which individual chips are extracted from a wafer, the semiconductor device 10 outputs various data regarding the position information and categories of individual chips to a chip transport device (that transports chips already subjected to dicing to trays, not shown) in units of wafers.

With reference to the aforementioned data regarding the position information and categories, chips diced from a wafer are appropriately transported to trays suiting categories thereof.

In packaging of chips, it is possible to appropriately sort chips over categories based on their electric characteristics.

In short, when operation voltages are appropriately controlled in response to contact resistances and threshold voltages of MOS transistors within prescribed power voltages preset to products (e.g. chips and semiconductor devices), it is possible to detect the relationships between characteristics and operation voltages with respect to individual products, which are thus appropriately subjected to sorting. Thus, it is possible to improve yields in sorting in the final stage of manufacturing, and it is possible to improve reliabilities in manufacturing products, thus avoiding the occurrence of defectiveness and trouble in the market.

Figure 9A:
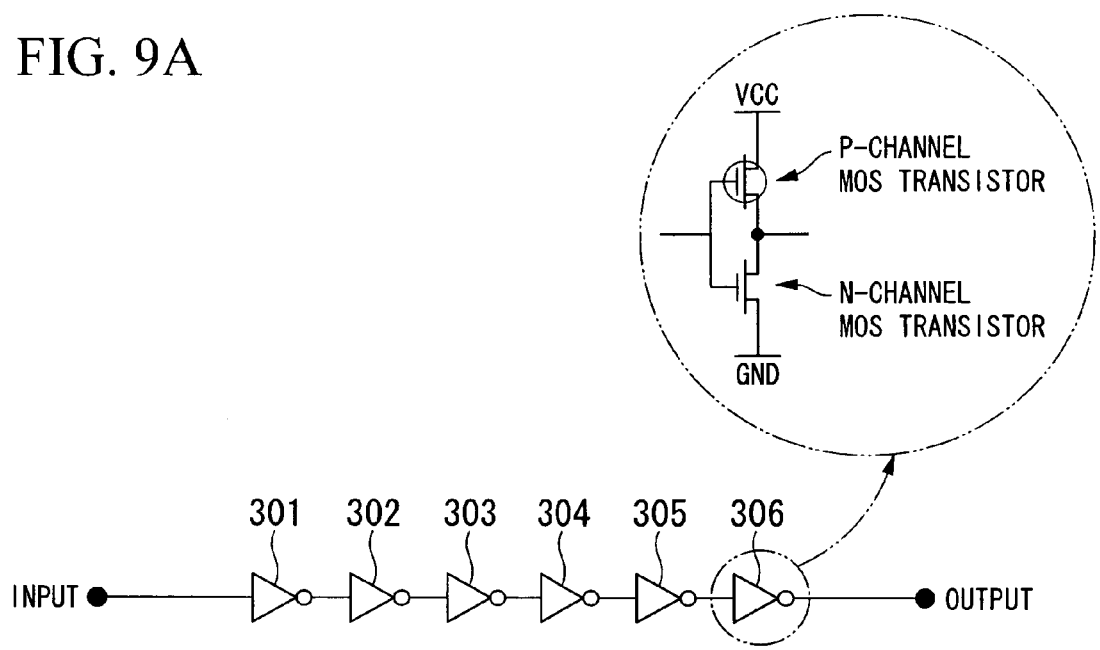
FIG. 9A shows a delay circuit including six inverters, each of which is configured using a pair of MOS transistors.
Figure 9B:
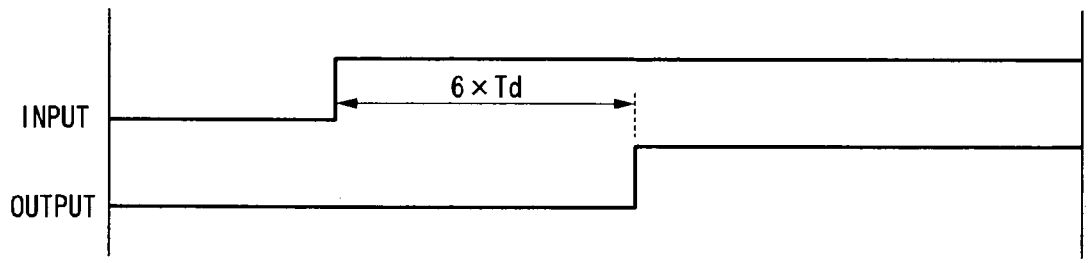
FIG. 9B shows the relationship between an input signal and an output signal of the delay circuit with respect to time.

FIG. 9A shows the configuration of a delay circuit including six inverters 301 to 306, each of which has the same delay time Td. Hence, an input signal of the delay circuit of FIG. 9A is delayed by a prescribed delay time "6×Td" corresponding to the six inverters 301 to 306.

Each of the inverters 301 to 306 is configured using a p-channel MOS transistor and an n-channel MOS transistor (each having the threshold voltage Vt), which are coupled together between a power line VCC (i.e. power voltage) and a ground line GND (see a dashed circle in FIG. 9A). The delay time of the delay circuit may vary due to variations of the threshold voltages Vt of the MOS transistors forming each inverter.

As the threshold voltage Vt of the MOS transistor increases high, the switching speed of the MOS transistor decreases low.

With respect to each chip whose threshold voltage Vt is relatively higher than the prescribed voltage range, the power voltage VCC (i.e. operation voltage) of each inverter is increased to be higher than the prescribed voltage range in advance. Hence, even when the threshold voltages Vt increases high due to dispersions of mass production, it may be possible to prevent the delay time of the delay circuit from increasing beyond the prescribed range of the delay time.

In the design stage, the delay time of the delay circuit is appropriately adjusted in accordance with technical specifications of products (i.e. inverters) in consideration of the maximum values and the minimum values of threshold voltages Vt due to dispersions of mass production.

However, when there is extreme dispersion between the maximum values and the minimum values of the threshold voltages Vt, which are determined in advance with respect to products, it may be very difficult to set up appropriate operation voltages demonstrating the maximum performance of the products. That is, when operation voltages are determined in consideration of the maximum values of the threshold voltages Vt only, defectiveness may occur in the case of the minimum values of the threshold voltages Vt. When operation voltages are determined in consideration of the minimum values of the threshold voltages Vt only, defectiveness may occur in the case of the maximum values of the threshold voltages Vt.

The present embodiment can be adapted to evaluation fittings, wherein it is possible to set appropriate operation voltages demonstrating the maximum performance of products irrespective of extreme dispersions between the maximum values and the minimum values.

In addition, the present embodiment can be adapted to appropriately adjust the delay time irrespective of dispersions of contact resistances (serving as parameters) between their maximum values and minimum values.

Figure 10:
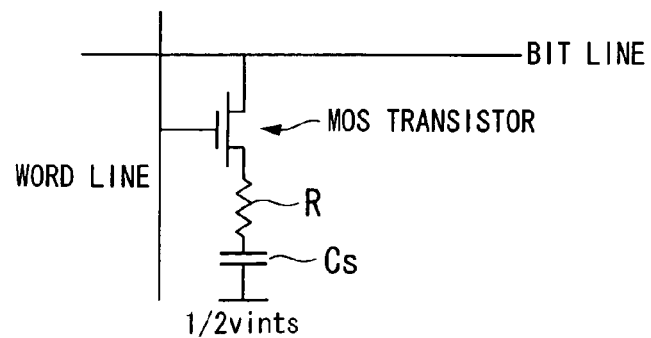
FIG. 10 shows an equivalent circuit of a memory cell formed between a bit line and a word line.

FIG. 10 shows an equivalent circuit of a memory cell formed between a bit line and a word line. The memory cell is constituted of a MOS transistor, an on-resistance R of the MOS transistor, and a capacitance Cs. Herein, electric charges are accumulated so as to write data into the capacitance Cs, wherein when the on-resistance R of the MOS transistor is relatively high, it may be very difficult to write data within a prescribed time that is set in advance in accordance with the technical specification of a product.

The TEG test using the foregoing parameters is performed so as to measure an on-resistance of a MOS transistor that is similar to the MOS transistor for performing switching of the memory cell shown in FIG. 10. When the result of the TEG test shows that the measured on-resistance is close to the maximum value within the prescribed range, a write voltage applied to the bit line is set to a relatively high value within the prescribed range, thus making it possible to easily accumulate electric charges in the capacitance Cs.

Programs achieving functions of the semiconductor test device 10 for performing the foregoing tests on chips can be stored in computer-readable storage media in advance. These programs are loaded into a prescribed computer system (not shown) and are then executed, thus performing the foregoing tests on chips. The computer system may embrace software such as an operating system (OS) and hardware such as peripheral devices. In addition, the computer system may further embrace world wide webs (WWW) realizing environments (or displays) for providing home pages, for example. The computer-readable storage media may embrace flexible disks, magneto-optical disks, ROM, portable media such as CD-ROMs, and storage devices such as hard-disk drives driving hard disks incorporated in the computer system. In addition, the computer-readable storage media may further embrace other types of telecommunications media, which can retain programs in certain times, e.g. networks such as the Internet, and volatile memories (e.g. RAM), which may act as servers and clients in the computer system so as to receive programs via communication lines such as telephone lines.

The aforementioned programs are temporarily stored in a certain storage device incorporated in one computer system and are then transmitted to another computer system via transmission media or by way of transmission waves. The transmission media are media having functions of transmitting information and data, e.g. networks (or communication networks) such as the Internet, and communication lines such as telephone lines. Programs can be modified to achieve a part of the functions of the semiconductor test device 10. Alternatively, they can be modified in the form of difference files (or difference programs) that can be combined with pre-installed programs of the computer system.

Lastly, the present invention is not necessarily limited to the present embodiment, which can be further modified in a variety of ways within the scope of the invention as defined in the appended claims.

What is claimed is:

1. A semiconductor device in which a test element group including at least one check pattern is formed in connection with a chip formed on a wafer so as to measure electric characteristics thereof, said semiconductor device comprising:
   an interface circuit for selecting the check pattern from among the test element group;
   a protection resistor that is connected in series with the test element group in the interface circuit so as to protect the test element group; and
   a dummy element that is connected in series with the test element group in the interface circuit.

2. A semiconductor device according to claim 1, wherein the interface circuit has a first pad for receiving an input signal designating the check pattern selected from among the test element group in response to a control signal and a second pad for outputting a test result of the designated check pattern.

3. A semiconductor device according to claim 2, wherein the dummy element is connected in series with the protection resistor in the interface circuit, and
   wherein, when the dummy element is selected, a node between the check pattern and the protection resistor is connected to the second pad for outputting the test result.

4. A semiconductor device according to claim 1, wherein a plurality of test element groups and a plurality of dummy elements are formed in a periphery of the chip.

5. A method for testing a semiconductor device, in which a test element group including at least one check pattern is formed in connection with a chip formed on a wafer so as to measure electric characteristics thereof and which includes an interface circuit for selecting the check pattern from among the test element group, a protection resistor that is connected in series with the test element group in the interface circuit so as to protect the test element group, and a dummy element that is connected in series with the test element group in the interface circuit, said method comprising:
   controlling the interface circuit so as to test the check pattern of the test element group, wherein a parasitic resistance of the interface circuit and a resistance of the protection resistor are calculated based on the measured electric characteristics of the check pattern;
   determining whether or not the measured electric characteristics of the check pattern fall within a prescribed range, which is determined in advance; and
   storing a test result of the check pattern in a storage device in connection with a wafer number and a chip number indicating position information of the chip on the wafer.

6. The method for testing the semiconductor device according to claim 5, wherein the interface circuit has a first pad for receiving an input signal designating the check pattern selected from among the test element group in response to a control signal and a second pad for outputting a test result of the designated check pattern.

7. The method for testing the semiconductor device according to claim 6, wherein the dummy element is connected in series with the protection resistor in the interface circuit, and wherein, when the dummy element is selected, a node between the check pattern and the protection resistor is connected to the second pad for outputting the test result.

8. The method for testing the semiconductor device according to claim 5, wherein a pass or fail decision is made as to whether the measured electric characteristics of the check pattern fall within the prescribed range, and accordingly setting a flag with respect to the chip on the wafer.

9. The method for testing the semiconductor device according to claim 5, further comprising correcting the test result of the check pattern based on the calculated parasitic resistance and the calculated resistance of the protection resistor.

10. The method for testing the semiconductor device according to claim 8, further comprising correcting the test result of the check pattern based on the calculated parasitic resistance and the calculated resistance of the protection resistor.

* * * * *